(12) United States Patent
Koga

(10) Patent No.: US 12,464,640 B2
(45) Date of Patent: Nov. 4, 2025

(54) POWER MODULE

(71) Applicant: ROHM CO., LTD., Kyoto (JP)

(72) Inventor: Akihiro Koga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 321 days.

(21) Appl. No.: 18/044,326

(22) PCT Filed: Oct. 7, 2021

(86) PCT No.: PCT/JP2021/037105
§ 371 (c)(1),
(2) Date: Mar. 7, 2023

(87) PCT Pub. No.: WO2022/085466
PCT Pub. Date: Apr. 28, 2022

(65) Prior Publication Data
US 2023/0337357 A1    Oct. 19, 2023

(30) Foreign Application Priority Data
Oct. 21, 2020    (JP) .................................. 2020-176642

(51) Int. Cl.
*H05K 1/02*    (2006.01)
*H02M 7/00*    (2006.01)
(Continued)

(52) U.S. Cl.
CPC .......... *H05K 1/0296* (2013.01); *H02M 7/003* (2013.01); *H02M 7/483* (2013.01);
(Continued)

(58) Field of Classification Search
CPC ....... H01L 23/13; H01L 24/41; H01L 25/072; H02M 7/003; H02M 7/539; H02M 7/483;
(Continued)

(56) References Cited

U.S. PATENT DOCUMENTS 9,685,900 B2 *   6/2017   El-Refaie ................ H02P 27/08

FOREIGN PATENT DOCUMENTS

JP        2001-332679 A       11/2001
JP        2004201462 A   *   7/2004
(Continued)

OTHER PUBLICATIONS

JP-2004201462-A machine translation Mar. 19, 2025.*
(Continued)

*Primary Examiner* — Leda T Pham
(74) *Attorney, Agent, or Firm* — HSML P.C.

(57) ABSTRACT

A power module includes a insulation substrate, a first and a second input terminal supported by the insulation substrate, a plurality of arm circuits provided on the insulation substrate, and a plurality of output terminals corresponding to the plurality of arm circuits. The arm circuits each include a part of a wiring pattern formed on the insulation substrate, and a first switching element and a second switching element mutually connected in series via the part of the wiring pattern. The output terminals are each connected to a connection point between the first switching element and the second switching element in a corresponding one of the plurality of arm circuits. The plurality of arm circuits are located so as to overlap with a circle surrounding the first input terminal, as viewed in a thickness direction the insulation substrate.

15 Claims, 12 Drawing Sheets

(51) Int. Cl.
  *H02M 7/483* (2007.01)
  *H02M 7/539* (2006.01)
  *H02P 27/06* (2006.01)
  *H05K 1/18* (2006.01)
(52) U.S. Cl.
  CPC ............ *H02M 7/539* (2013.01); *H02P 27/06* (2013.01); *H05K 1/181* (2013.01); *H05K 2201/1009* (2013.01)
(58) Field of Classification Search
  CPC ... H02M 7/5387; H05K 1/181; H05K 1/0296; H02P 27/06
  See application file for complete search history.

(56) References Cited

FOREIGN PATENT DOCUMENTS

| JP | 2007116840 A | * | 5/2007 |
| JP | 2012-39784 A | | 2/2012 |

OTHER PUBLICATIONS

JP-2007116840-A machine translation Mar. 19, 2025.*
International Search Report issued in PCT/JP2021/037105, Dec. 28, 2021 (2 pages).
Office Action issued in corresponding Japanese Patent application No. 2022-557420, Jun. 10, 2025, and machine translation (10 pages).

* cited by examiner

10
POWER MODULE

TECHNICAL FIELD

The present disclosure relates to a power module.

BACKGROUND ART

Power modules that include a power switching element, such as a metal oxide semiconductor field effect transistor (MOSFET) or an insulated gate bipolar transistor (IGBT), are thus far known. Such power modules are widely used for various electric devices, ranging from industrial apparatuses to home electric appliances, information terminals, automobile-related devices, and so forth. Patent document 1 discloses a motor drive system including a power module (power device). In the motor drive system according to document 1, the power module includes a plurality of transistors, and is configured to supply a three-phase sine wave voltage to a motor, according to a drive signal inputted from a drive circuit.

PRIOR ART DOCUMENTS

Patent Document

Document 1: JP-A-2012-39784

SUMMARY OF INVENTION

Problem to be Solved by the Invention

From the view point of reduction in energy consumption by electric devices, improvement in power conversion efficiency of the power module is being sought for. To improve the power conversion efficiency, it is useful, for example, to reduce the inductance in the power module.

In view of the foregoing situation, the present disclosure provides a power module capable of reducing the inductance.

Means for Solving the Problem

In an aspect, the present disclosure provides a power module including an insulation substrate, a first input terminal supported by the insulation substrate, a second input terminal supported by the insulation substrate, a plurality of arm circuits provided on the insulation substrate, and a plurality of output terminals corresponding to the plurality of arm circuits, respectively. Each of the plurality of arm circuits includes a part of a wiring pattern formed on the insulation substrate, and a first switching element and a second switching element connected in series via the part of the wiring pattern. Each of the plurality of output terminals is connected to a connection point between the first switching element and the second switching element in a corresponding one of the plurality of arm circuits. The plurality of arm circuits are located so as to overlap with a circle surrounding the first input terminal, as viewed in a thickness direction the insulation substrate.

Advantages of Invention

With the above arrangements, it is possible to reduce the inductance in the power module.

MODE FOR CARRYING OUT THE INVENTION

Figure 1:
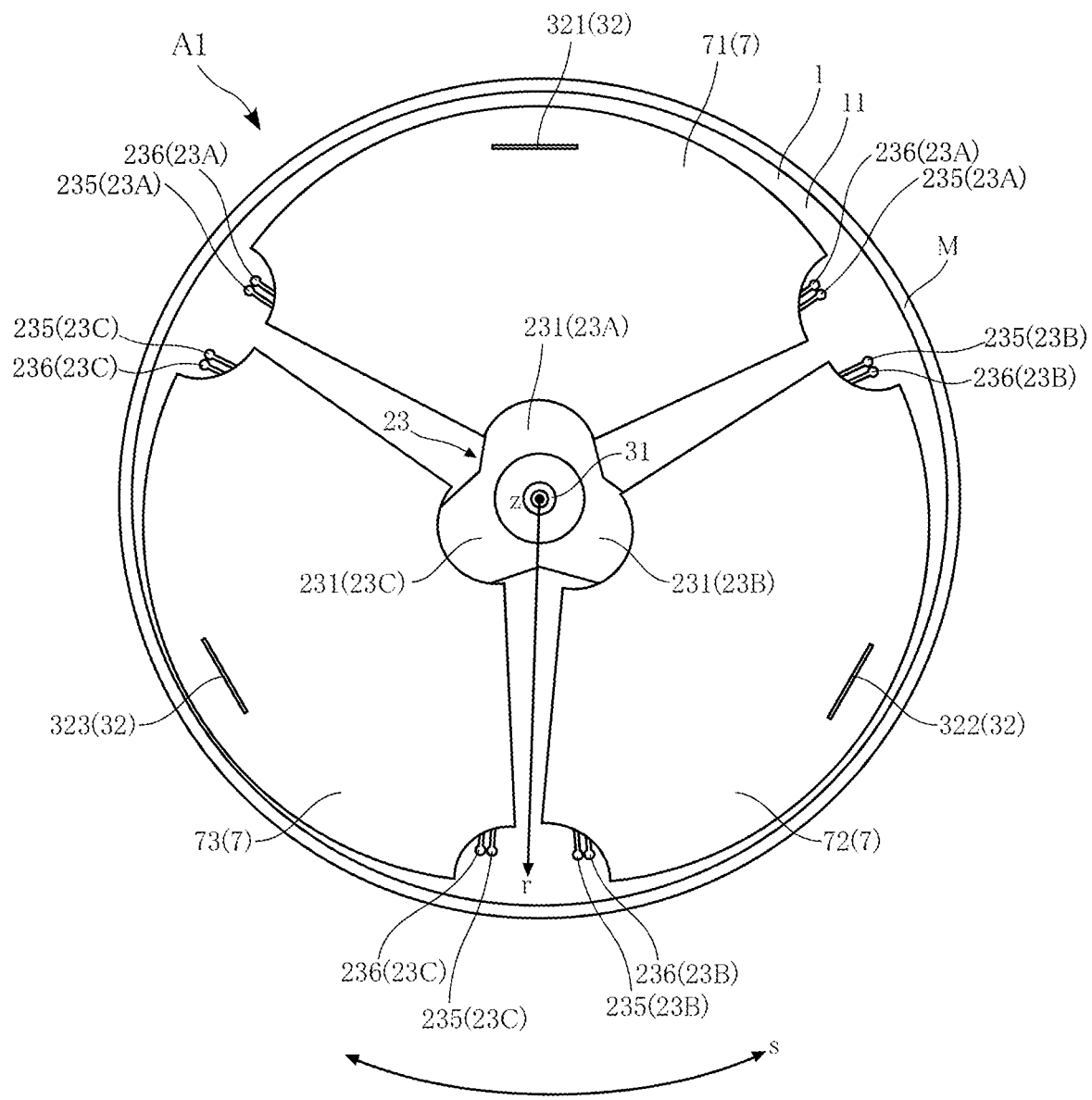
FIG. 1 is a plan view showing a power module according to a first embodiment.

Hereafter, exemplary embodiments of a power module according to the present disclosure will be described, with reference to the drawings. In the following description, same or similar elements will be given the same numeral, and duplicated description of such elements will be skipped.

FIG. 1 to FIG. 6 each illustrate a power module A1 according to a first embodiment. The power module A1 includes an insulation substrate 1, a plurality of arm circuits 2, a first input terminal 31, a second input terminal 32, a plurality of output terminals 4, a plurality of conductors 61, a plurality of wires 62, and a resin member 7.

Figure 2:
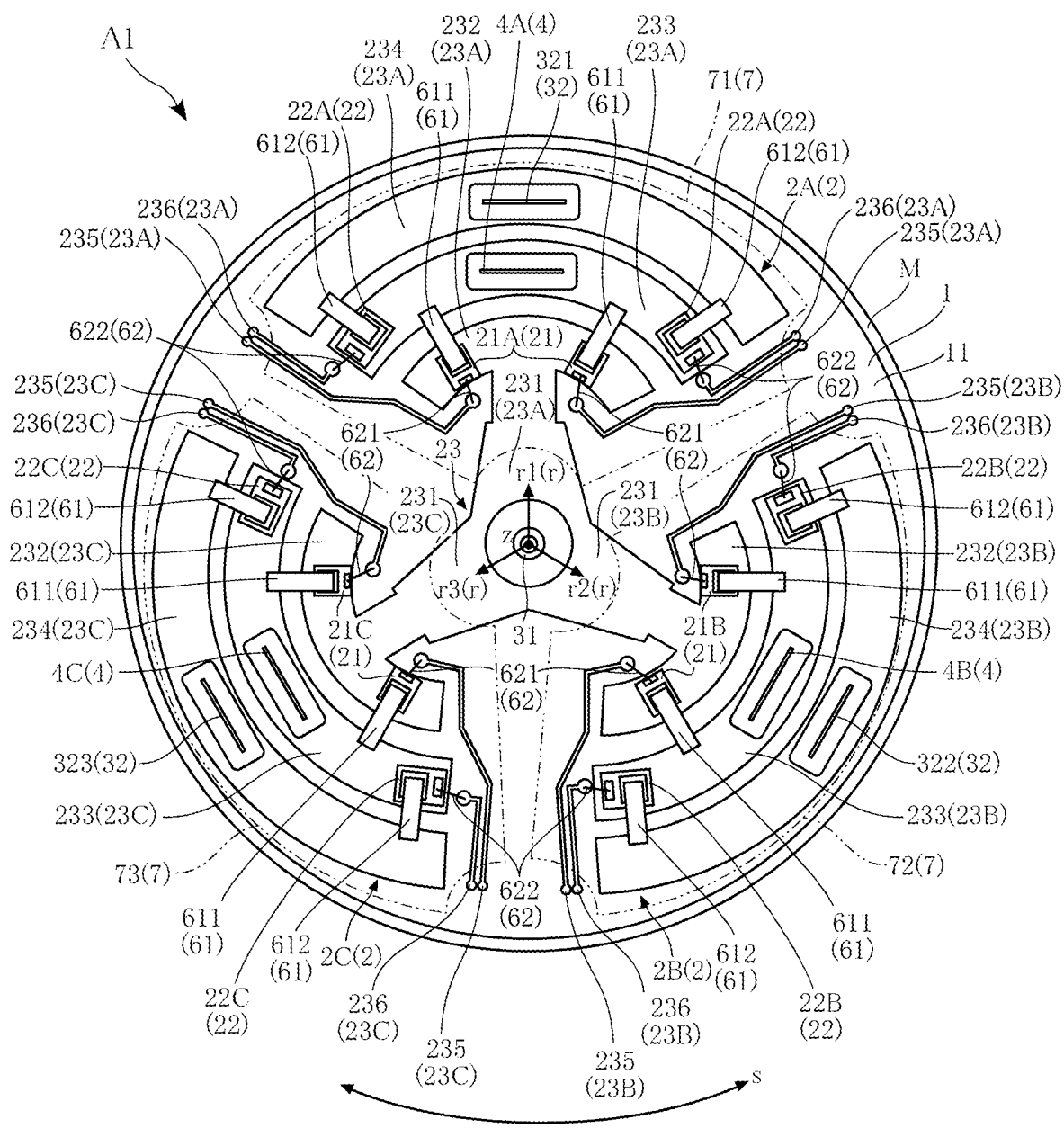
FIG. 2 is a plan view of the power module shown in FIG. 1, in which a resin member is indicated by imaginary lines.
Figure 3:
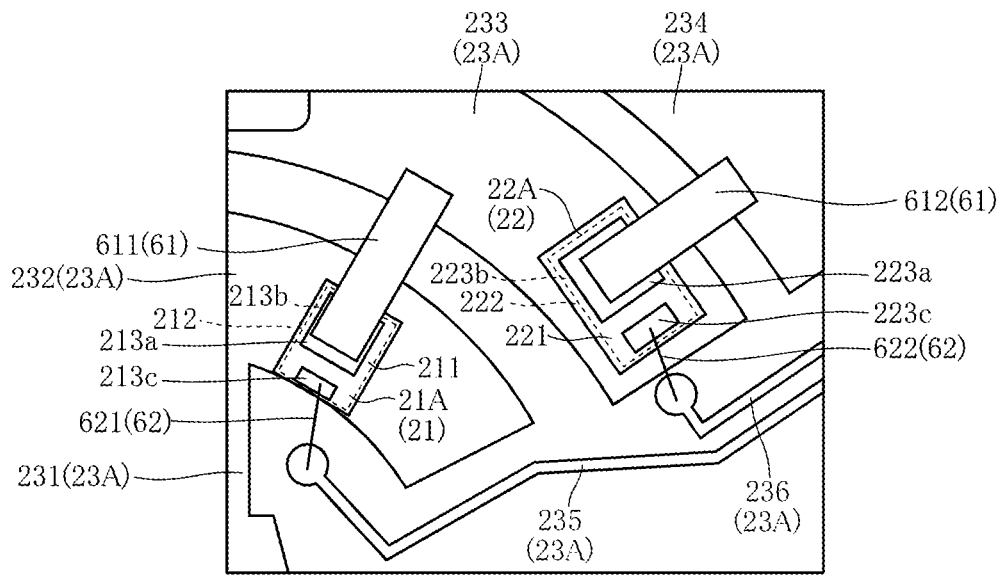
FIG. 3 is an enlarged view of a part of FIG. 2.
Figure 4:
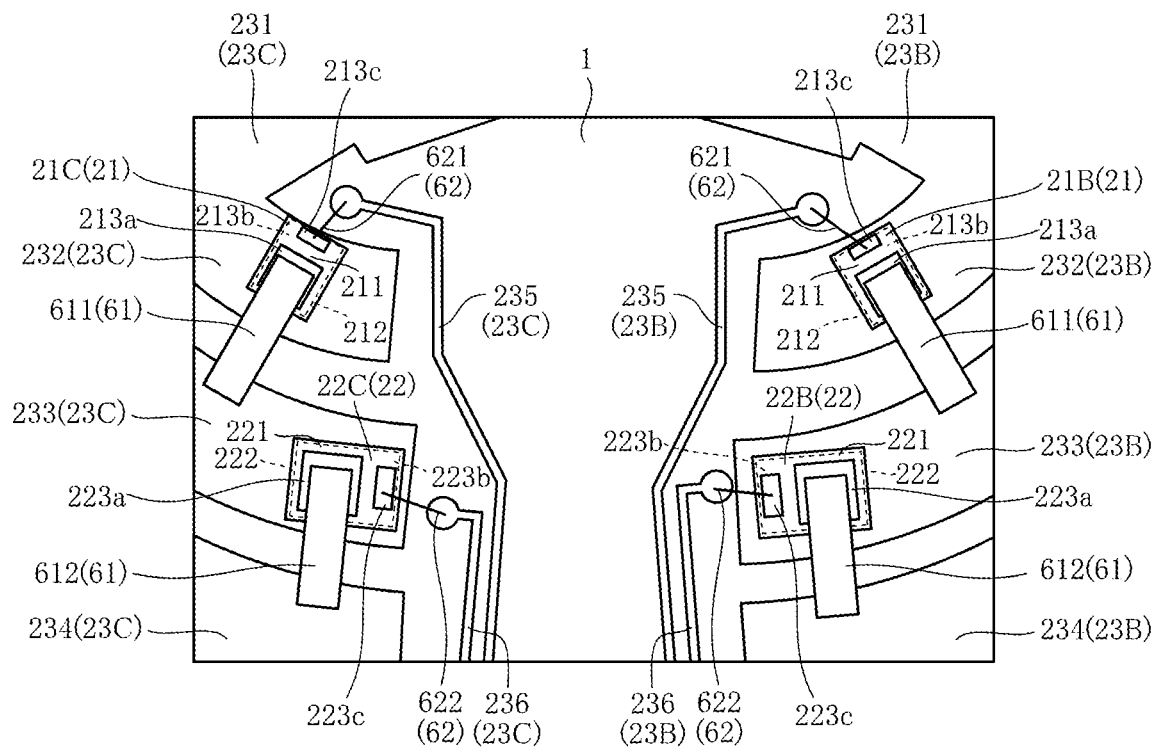
FIG. 4 is an enlarged view of another part of FIG. 2.
Figure 5:
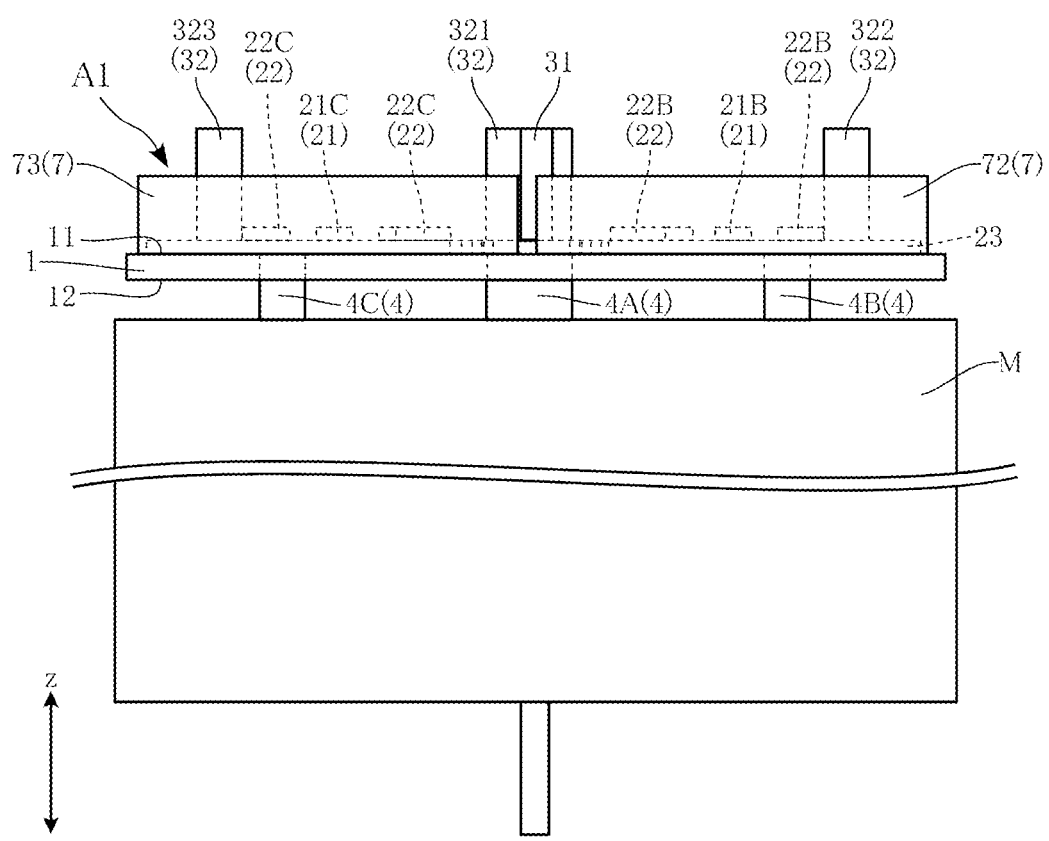
FIG. 5 is a front view showing the power module according to the first embodiment.
Figure 6:
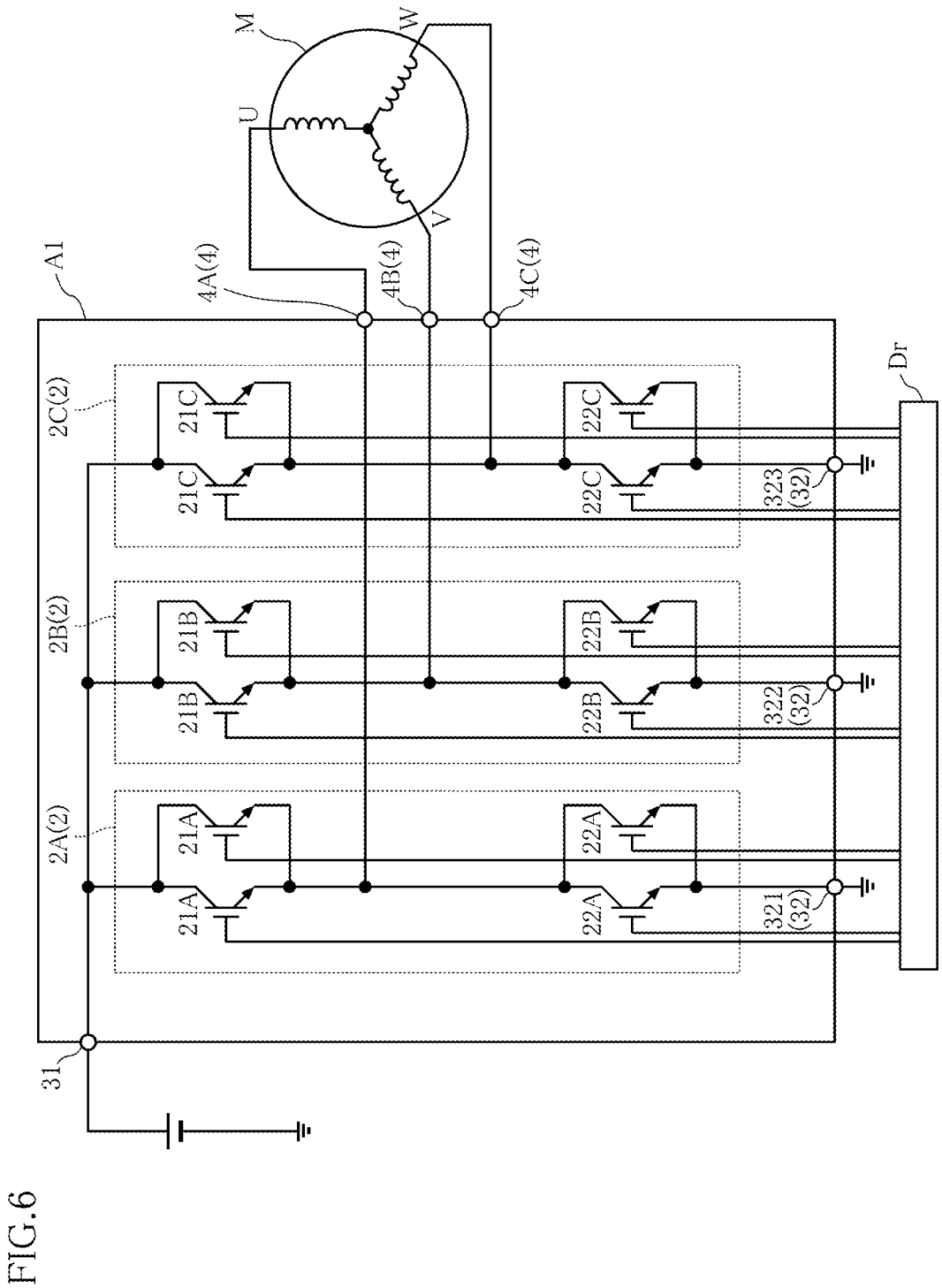
FIG. 6 is a diagram showing an exemplary circuit configuration of the power module according to the first embodiment.

FIG. 1 is a plan view showing the power module A1. FIG. 2 is a plan view of the power module A1, in which the resin member 7 is indicated by imaginary lines (dash-dot-dot lines). FIG. 3 and FIG. 4 are enlarged views of a part of FIG. 2. In FIG. 3 and FIG. 4, the resin member 7 is excluded. FIG. 5 is a front view showing the power module A1. In FIG. 5, the resin member 7 is indicated by imaginary lines (dash-dot-dot lines). FIG. 6 is a diagram showing an exemplary circuit configuration of the power module A1.

The power module A1 is a three-phase inverter, for example for driving a three-phase motor M. Although Y-connection is adopted in the example shown in FIG. 6, Delta connection may be adopted instead. For example, the power module A1 converts a DC voltage inputted from a DC power source into an AC voltage, and supplies the AC voltage to the three-phase motor M, with a configuration to be subsequently described in detail. The power module A1 includes a plurality of switching elements (plurality of first switching elements 21 and plurality of second switching elements 22, to be subsequently described), and converts the voltage by driving the plurality of switching elements. In the power module A1, as shown in FIG. 6, the operation of the plurality of switching elements is controlled by control signals (first control signal and second control signal, to be subsequently described) inputted from an external drive circuit Dr.

The insulation substrate 1, and a wiring pattern 23 to be subsequently described, constitute a circuit board of the power module A1. The insulation substrate 1 may be constituted of, for example, one of glass epoxy resin, ceramics, and silicon. The insulation substrate 1 has, for example, a circular shape as viewed in a thickness direction z thereof. Hereinafter, the view in the thickness direction z of the insulation substrate 1 may also be referred to as "plan view". The plan-view shape of the insulation substrate 1 is not limited to circular, but may be rectangular, polygonal, or elliptical.

As shown in FIG. 5, the insulation substrate 1 includes a substrate obverse face 11 and a substrate reverse face 12. The substrate obverse face 11 and the substrate reverse face 12 are spaced apart from each other in the thickness direction z. The substrate obverse face 11 is oriented to one side (upward) in the thickness direction z, and the substrate reverse face 12 is oriented to the other side (downward) in the thickness direction z. On the substrate obverse face 11, the wiring pattern 23 is formed. As shown in FIG. 5, the three-phase motor M is located on the side of the substrate reverse face 12 of the insulation substrate 1, in the thickness direction z.

The plurality of arm circuits 2 include the wiring pattern 23, and are each electrically connected to the first input terminal 31 and the second input terminal 32, via the wiring pattern 23. The power module A1 includes three arm circuits 2, as shown in FIG. 2 and FIG. 6. When the three arm circuits 2 are to be distinguished from each other, the arm circuits will be referred to as a first arm circuit 2A, a second arm circuit 2B, and a third arm circuit 2C.

The plurality of arm circuits 2 (first arm circuit 2A, second arm circuit 2B, and third arm circuit 2C) each include a part of the wiring pattern 23, the first switching element 21, and the second switching element 22. In the power module A1, the arm circuits 2 each include two first switching elements 21 and two second switching elements 22. For the sake of clarity, the first switching element 21 and the second switching element 22 of the first arm circuit 2A may be referred to as a first switching element 21A and a second switching element 22A, respectively. Likewise, the first switching element 21 and the second switching element 22 of the first arm circuit 2B may be referred to as a first switching element 21B and a second switching element 22B, respectively, and the first switching element 21 and the second switching element 22 of the first arm circuit 2C may be referred to as a first switching element 21C and a second switching element 22C, respectively.

The first switching elements 21 and the second switching elements 22 may each be constituted of an IGBT, as shown in FIG. 6. The first switching elements 21 and the second switching elements 22 may each be constituted of a different transistor, such as a MOSFET, without limitation to the IGBT. As shown in FIG. 6, the two first switching elements 21 are connected in parallel, and the two second switching elements 22 are also connected in parallel, in each of the arm circuits 2. As shown in FIG. 6, in addition, in each of the arm circuits 2, the first switching element 21 and the second switching element 22 are connected in series, and one each of the plurality of output terminals 4 is connected to the connection point between the first switching element 21 and the second switching element 22. To be more specific, to the connection point between the first switching element 21A and the second switching element 22A, one of the plurality of output terminals 4 (first output terminal 4A to be subsequently described) is connected; to the connection point between the first switching element 21B and the second switching element 22B, one of the plurality of output terminals 4 (first output terminal 4B to be subsequently described) is connected; and to the connection point between the first switching element 21C and the second switching element 22C, one of the plurality of output terminals 4 (first output terminal 4C to be subsequently described) is connected. In each of the arm circuits 2, the first switching element 21 is the upper arm, and the second switching element 22 is the lower arm. In other words, the first switching element 21A is the upper arm of the first arm circuit 2A, and the second switching element 22A is the lower arm of the first arm circuit 2A. The first switching element 21B is the upper arm of the first arm circuit 2B, and the second switching element 22B is the lower arm of the first arm circuit 2B. The first switching element 21C is the upper arm of the first arm circuit 2C, and the second switching element 22C is the lower arm of the first arm circuit 2C.

The plurality of first switching elements 21 (plurality of first switching elements 21A, 21B, and 21C) each include, as may be apparent from FIG. 3 and FIG. 4, a first element obverse face 211 and a first element reverse face 212. The first element obverse face 211 and the first element reverse face 212 are spaced apart from each other in the thickness direction z. The first element obverse face 211 is oriented to one side in the thickness direction z, and the first element reverse face 212 is oriented to the other side in the thickness direction z. In the power module A1, the first element obverse face 211 is oriented to the same side as the substrate obverse face 11 is, and the first element reverse face 212 is oriented to the same side as the substrate reverse face 12 is.

The plurality of first switching elements 21 (plurality of first switching elements 21A, 21B, and 21C) each include, as may be apparent from FIG. 3 and FIG. 4, a first obverse face electrode 213a, a first reverse face electrode 213b, and a first control electrode 213c.

In each of the first switching elements 21, the first obverse face electrode 213a and the first control electrode 213c are each located on the first element obverse face 211, as shown in FIG. 3 and FIG. 4. The first reverse face electrode 213b is, as may be apparent from FIG. 3 and FIG. 4, located on the first element reverse face 212. In the example where the first switching element 21 is the IGBT, for example the first obverse face electrode 213a is the emitter, the first reverse face electrode 213b is the collector, and the first control electrode 213c is the gate. The switching operation of each of the first switching elements 21 is controlled according to the first control signal (e.g., gate voltage) inputted to the first control electrode 213c. The switching operation refers to the operation of switching between an electrically connected state and a disconnected state. In each of the first switching elements 21, the current flows from the first reverse face electrode 213b (collector) to the first obverse face electrode 213a (emitter) in the electrically connected state, but the current does not flow in the disconnected state.

In each of the first switching elements 21, the first obverse face electrode 213a is, as shown in FIG. 3 and FIG. 4, electrically connected to the second switching element 22, via the conductor 61 (first conductor 611 to be subsequently described) and a part of the wiring pattern 23 (third conductive section 233 to be subsequently described), and electrically connected to the output terminal 4. The first reverse face electrode 213b is electrically connected to the first input terminal 31, via a part of the wiring pattern 23 (second conductive section 232 to be subsequently described). The first control electrode 213c is, as shown in FIG. 3 and FIG. 4, electrically connected to a part of the wiring pattern 23 (fifth conductive section 235 to be subsequently described), via the wire 62 (first wire 621 to be subsequently described).

The plurality of second switching elements 22 (plurality of second switching elements 22A, 22B, and 22C) each include, as may be apparent from FIG. 3 and FIG. 4, a second element obverse face 221 and a second element reverse face 222. The second element obverse face 221 and the second element reverse face 222 are spaced apart from each other in the thickness direction z. The second element obverse face 221 is oriented to one side in the thickness direction z, and the second element reverse face 222 is oriented to the other side in the thickness direction z. In the power module A1, the second element obverse face 221 is oriented to the same side as the substrate obverse face 11 and the first element obverse face 211 are, and the second element reverse face 222 is oriented to the same side as the substrate reverse face 12 and the first element reverse face 212 are.

The plurality of second switching elements 22 (plurality of second switching elements 22A, 22B, and 22C) each include, as may be apparent from FIG. 3 and FIG. 4, a second obverse face electrode 223a, a second reverse face electrode 223b, and a second control electrode 223c.

In each of the second switching elements 22, the second obverse face electrode 223a and the second control electrode 223c are each located on the second element obverse face 221, as shown in FIG. 3 and FIG. 4. The second reverse face electrode 223b is, as may be apparent from FIG. 3 and FIG. 4, located on the second element reverse face 222. In the example where the second switching element 22 is the IGBT, for example the second obverse face electrode 223a is the emitter, the second reverse face electrode 223b is the collector, and the second control electrode 223c is the gate. The switching operation of each of the second switching element 22 is controlled according to the second control signal (e.g., gate voltage) inputted to the second control electrode 223c. The switching operation refers to the operation of switching between an electrically connected state and a disconnected state. In each of the second switching element 22, the current flows from the second reverse face electrode 223b (collector) to the second obverse face electrode 223a (emitter) in the electrically connected state, but the current does not flow in the disconnected state.

In each of the second switching elements 22, the second obverse face electrode 223a is, as shown in FIG. 3 and FIG. 4, electrically connected to the second input terminal 32, via the conductor 61 (second conductor 612 to be subsequently described) and a part of the wiring pattern 23 (fourth conductive section 234 to be subsequently described). The second reverse face electrode 223b is electrically connected to the output terminal 4, via a part of the wiring pattern 23 (third conductive section 233 to be subsequently described), and electrically connected to the first obverse face electrode 213a of the first switching element 21, via a part of the wiring pattern 23 (third conductive section 233 to be subsequently described) and the conductor 61 (first conductor 611 to be subsequently described). The second control electrode 223c is, as shown in FIG. 3 and FIG. 4, electrically connected to a part of the wiring pattern 23 (sixth conductive section 236 to be subsequently described), via the wire 62 (second wire 622 to be subsequently described).

The wiring pattern 23 is formed on the substrate obverse face 11 of the insulation substrate 1. The wiring pattern 23 includes a first wiring section 23A constituting the first arm circuit 2A, a second wiring section 23B constituting the second arm circuit 2B, and a third wiring section 23C constituting the third arm circuit 2C.

The first wiring section 23A serves as the electrical path of the first arm circuit 2A. The first wiring section 23A is electrically connected to the first input terminal 31 and the second input terminal 32. The first wiring section 23A makes the first switching element 21A and the second switching element 22A electrically connected to each other, together with the plurality of conductors 61 respectively connected to the first switching element 21A and the second switching element 22A.

The second wiring section 23B serves as the electrical path of the second arm circuit 2B. The second wiring section 23B is electrically connected to the first input terminal 31 and the second input terminal 32. The second wiring section 23B makes the first switching element 21B and the second switching element 22B electrically connected to each other, together with the plurality of conductors 61 respectively connected to the first switching element 21B and the second switching element 22B.

The third wiring section 23C serves as the electrical path of the third arm circuit 2C. The third wiring section 23C is electrically connected to the first input terminal 31 and the second input terminal 32. The third wiring section 23C makes the third switching element 21C and the second switching element 22C electrically connected to each other, together with the plurality of conductors 61 respectively connected to the first switching element 21C and the second switching element 22C.

The first wiring section 23A, the second wiring section 23B, and the third wiring section 23C each include a first conductive section 231, a second conductive section 232, a third conductive section 233, a fourth conductive section 234, a fifth conductive section 235, and a sixth conductive section 236.

The first conductive section 231 is connected to the first input terminal 31. In a plan view, the first conductive section 231 radially extends from the first input terminal 31, in a radial direction r. In the power module A1, the first conductive section 231 of the first wiring section 23A, the first conductive section 231 of the second wiring section 23B, and the first conductive section 231 of the third wiring section 23C are connected to each other.

The second conductive section 232 is connected to the first conductive section 231. The second conductive section 232 has, for example, an annular fan shape in a plan view. In the example shown in FIG. 2, the first conductive section 231 is connected to a generally central portion of the second conductive section 232 in a circumferential direction s. Two first switching elements 21 are connected to each of the second conductive sections 232, which is electrically connected to the first reverse face electrodes 213b of the respective first switching elements 21. The two first switching elements 21 are, as shown in FIG. 2, located on the respective sides of the portion of the second conductive section 232 connected to the first conductive section 231, in the circumferential direction s.

The third conductive section 233 is electrically connected to the connection point between the first switching element 21 and the second switching element 22. The third conductive section 233 has, for example, an annular fan shape in a plan view. Two second switching elements 22 are connected to each of the third conductive sections 233, which is electrically connected to second reverse face electrodes 223b of the respective second switching elements 22. The two second switching elements 22 are, as shown in FIG. 2, located at the respective end portions of the third conductive section 233, in the circumferential direction s. In addition, the third conductive section 233 is electrically connected to the first obverse face electrodes 213a of the respective first switching elements 21, via the conductor 61 (first conductor 611 to be subsequently described). The third conductive section 233 is, as shown in FIG. 2, located on the outer side of the second conductive section 232 in the radial direction r, with respect to the first input terminal 31, in a plan view.

The fourth conductive section 234 is electrically connected to each of the second switching elements 22. The fourth conductive section 234 has, for example, an annular fan shape in a plan view. The fourth conductive section 234 is electrically connected to the second obverse face electrodes 223a of the respective second switching elements 22, via the conductor 61 (second conductor 612 to be subsequently described). The fourth conductive section 234 is, as shown in FIG. 2, located on the outer side of the third conductive section 233 in the radial direction r, with respect to the first input terminal 31, in a plan view.

Two fifth conductive sections 235 are each electrically connected to the first control electrode 213c of the first switching element 21, via the wire 62 (first wire 621 to be subsequently described). To each of the fifth conductive sections 235, the first control signal for controlling the switching operation of the first switching element 21 is inputted, from the drive circuit Dr.

Two sixth conductive sections 236 are each electrically connected to the second control electrode 223c of the second switching element 22, via the wire 62 (second wire 622 to be subsequently described). To each of the sixth conductive sections 236, the second control signal for controlling the switching operation of the second switching element 22 is inputted, from the drive circuit Dr.

In the power module A1, the first wiring section 23A, the second wiring section 23B, and the third wiring section 23C are aligned along the circumferential direction s about the first input terminal 31, and the plurality of arm circuits 2 (first arm circuit 2A, second arm circuit 2B, and third arm circuit 2C) are located so as to overlap with a circle surrounding the first input terminal 31, in a plan view. Although it is preferable that the circle surrounding the first input terminal 31 is centered by the first input terminal 31 in a plan view, the first input terminal 31 may be deviated from the center of the circle, provided that the first input terminal 31 is included within the circle. The expression "overlap with the circle" refers to a state where, when an imaginary circle is drawn, the imaginary circle is intersecting each arm circuit 2, in a plan view. In the power module A1, in particular, the first wiring section 23A, the second wiring section 23B, and the third wiring section 23C are located at regular angular intervals about the first input terminal 31, in a plan view. In other words, in the power module A1 including three arm circuits 2, the first wiring section 23A, the second wiring section 23B, and the third wiring section 23C are shifted from each other by approximately 120° (=360°/3) in the circumferential direction s, as shown in FIG. 2.

The first input terminal 31 and the second input terminal 32 are, for example, each connected to the power source (e.g., DC power source), and a source voltage (e.g., DC voltage) is applied between the terminals. In the power module A1, as shown in FIG. 6, the first input terminal 31 is a positive electrode (P-terminal), and the second input terminal 32 is a negative electrode (N-terminal). Differently from the power module A1, the first input terminal 31 may be the negative electrode (N-terminal), and the second input terminal 32 may be the positive electrode (P-terminal).

The first input terminal 31 is supported by the insulation substrate 1. The first input terminal 31 is erected on the substrate obverse face 11 of the insulation substrate 1, and extends upward in the thickness direction z. The first input terminal 31 is connected to the respective first conductive sections 231 of the first wiring section 23A, the second wiring section 23B, and the third wiring section 23C of the wiring pattern 23. The first input terminal 31 is located at a generally central position of the insulation substrate 1, in a plan view. Here, the first input terminal 31 may be located at a position spaced apart from the center in a plan view, instead of the generally central position, provided that, in the power module A1, the first wiring section 23A, the second wiring section 23B, and the third wiring section 23C are aligned in the circumferential direction s about the first input terminal 31, in a plan view.

The second input terminal 32 includes, as shown in FIG. 1 and FIG. 2, a first terminal section 321, a second terminal section 322, and a third terminal section 323, which are spaced apart from each other. The first terminal section 321, the second terminal section 322, and the third terminal section 323 are each supported by the insulation substrate 1.

As shown in FIG. 2, the first terminal section 321 is connected to the first wiring section 23A. The first terminal section 321 is overlapping with the fourth conductive section 234 of the first wiring section 23A, in a plan view. The first terminal section 321 is erected on the fourth conductive section 234 of the first wiring section 23A, and extends upward in the thickness direction z. The first terminal section 321 is, as shown in FIG. 5, protruding upward in the thickness direction z, from the resin member 7. The first terminal section 321 is electrically connected to the fourth conductive section 234 of the first wiring section 23A, and also with the second switching element 22A, via the fourth conductive section 234 and the conductor 61 (second conductor 612 to be subsequently described).

As shown in FIG. 2, the second terminal section 322 is connected to the second wiring section 23B. The second terminal section 322 is overlapping with the fourth conductive section 234 of the second wiring section 23B, in a plan view. The second terminal section 322 is erected on the fourth conductive section 234 of the second wiring section 23B, and extends upward in the thickness direction z. The second terminal section 322 is, as shown in FIG. 5, protruding upward in the thickness direction z, from the resin member 7. The second terminal section 322 is electrically connected to the fourth conductive section 234 of the second wiring section 23B, and also with the second switching element 22B, via the fourth conductive section 234 and the conductor 61 (second conductor 612 to be subsequently described).

As shown in FIG. 2, the third terminal section 323 is connected to the third wiring section 23C. The third terminal section 323 is overlapping with the fourth conductive section 234 of the third wiring section 23C, in a plan view. The third terminal section 323 is erected on the fourth conductive section 234 of the third wiring section 23C, and extends upward in the thickness direction z. The third terminal section 323 is, as shown in FIG. 5, protruding upward in the thickness direction z, from the resin member 7. The third terminal section 323 is electrically connected to the fourth conductive section 234 of the third wiring section 23C, and also with the second switching element 22C, via the fourth conductive section 234 and the conductor 61 (second conductor 612 to be subsequently described).

In the power module A1, the first terminal section 321, the second terminal section 322, and the second terminal section 322 are each connected to the ground as shown in FIG. 6, like the terminal of the DC power source on the side of the negative electrode.

The plurality of output terminals 4 each output, in each of the plurality of arm circuits 2, a voltage (e.g., AC voltage) converted by the switching operation by the first switching element 21 and the second switching element 22. The plurality of output terminals 4 include a first output terminal 4A, a second output terminal 4B, and a third output terminal 4C. The first output terminal 4A, the second output terminal 4B, and the third output terminal 4C are spaced apart from each other.

The first output terminal 4A is connected to the first wiring section 23A (wiring pattern 23 in the first arm circuit 2A). The first output terminal 4A is overlapping with the third conductive section 233 of the first wiring section 23A, in a plan view. The first output terminal 4A is, as shown in FIG. 2, located generally at the center of the two second switching elements 22A, in the circumferential direction s.

The second output terminal 4B is connected to the second wiring section 23B (wiring pattern 23 in the second arm circuit 2B). The second output terminal 4B is overlapping with the third conductive section 233 of the second wiring section 23B, in a plan view. The second output terminal 4B is, as shown in FIG. 2, located generally at the center of the two second switching elements 22B, in the circumferential direction s.

The third output terminal 4C is connected to the third wiring section 23C (wiring pattern 23 in the third arm circuit 2C). The third output terminal 4C is overlapping with the third conductive section 233 of the third wiring section 23C, in a plan view. The third output terminal 4C is, as shown in FIG. 2, located generally at the center of the two second switching elements 22C, in the circumferential direction s.

The first output terminal 4A, the second output terminal 4B, and the third output terminal 4C are, as shown in FIG. 5, each formed so as to penetrate through the insulation substrate 1 in the thickness direction z, from the substrate obverse face 11 to the substrate reverse face 12, and further extend downward from the substrate reverse face 12, in the thickness direction z. The first output terminal 4A, the second output terminal 4B, and the third output terminal 4C are each electrically connected to the wiring pattern 23, on the side of the substrate obverse face 11. The first output terminal 4A, the second output terminal 4B, and the third output terminal 4C are, as shown in FIG. 5, each connected to the three-phase motor M, on the side of the substrate reverse face 12. As shown in FIG. 6 for example, the first output terminal 4A is connected to the U-phase of the three-phase motor M, the second output terminal 4B is connected to the V-phase of the three-phase motor M, and the third output terminal 4C is connected to the W-phase of the three-phase motor M.

The plurality of conductors 61 each provide electrical connection between two elements spaced apart from each other. The conductors 61 are, for example, each formed of a metal plate material. The plurality of conductors 61 include a plurality of first conductors 611 and a plurality of second conductors 612.

The plurality of first conductor 611 are, as shown in FIG. 2 to FIG. 4, each connected to the first obverse face electrode 213a of the first switching element 21 and the third conductive section 233, for electrical connection therebetween, in each of the arm circuits 2. Here, to connect the first conductor 611 and the third conductive section 233, the first conductor 611 may be partially bent, or the thickness thereof may be partially increased. The plurality of second conductor 612 are, as shown in FIG. 2 to FIG. 4, each connected to the second obverse face electrode 223a of the second switching element 22 and the fourth conductive section 234, for electrical connection therebetween, in each of the arm circuits 2. Here, to connect the second conductor 612 and the fourth conductive section 234, the second conductor 612 may be partially bent, or the thickness thereof may be partially increased.

The plurality of wires 62 each provide electrical connection between two elements spaced apart from each other. The wire 62 is, for example, a bonding wire. Although the material of the wire 62 is not specifically limited, for example Au, Al, or Cu may be employed. The plurality of wires 62 include a plurality of first wires 621 and a plurality of second wires 622.

The plurality of first wires 621 are, as shown in FIG. 2 to FIG. 4, each connected to the first control electrode 213c of the first switching element 21 and the fifth conductive section 235, for electrical connection therebetween, in each of the arm circuits 2. The plurality of second wires 622 are, as shown in FIG. 2 to FIG. 4, each connected to the second control electrode 223c of the second switching element 22 and the sixth conductive section 236, for electrical connection therebetween, in each of the arm circuits 2.

The resin member 7 is, for example, formed of an insulative resin material (e.g., epoxy resin), and located on the substrate obverse face 11 of the insulation substrate 1. The resin member 7 covers a part of each of the arm circuits 2 (first arm circuit 2A, second arm circuit 2B, and third arm circuit 2C), and exposes the first input terminal 31 and the second input terminal 32. The resin member 7 includes a first sealing section 71, a second sealing section 72, and a third sealing section 73, which are spaced apart from each other.

The first sealing section 71 covers a part of the first arm circuit 2A. From the first sealing section 71, a part of the first conductive section 231 of the first wiring section 23A, a part of the fifth conductive section 235 of the first wiring section 23A, and a part of the sixth conductive section 236 of the first wiring section 23A are exposed, out of the first arm circuit 2A. In addition, as shown in FIG. 5, the first terminal section 321 (second input terminal 32) is protruding in the thickness direction z, from the upper face of the first sealing section 71. The first sealing section 71 has, as show in FIG. 1 and FIG. 2, an annular fan shape in a plan view. As shown in FIG. 1, the first sealing section 71 is partly cut away, and a part of the fifth conductive section 235 of the first wiring section 23A, and a part of the sixth conductive section 236 are exposed, from such cutaway portion. To the fifth conductive section 235 and the sixth conductive section 236 of the first wiring section 23A, exposed from the first sealing section 71, the drive circuit Dr is connected.

The second sealing section 72 covers a part of the second arm circuit 2B. From the second sealing section 72, a part of the first conductive section 231 of the second wiring section 23B, a part of the fifth conductive section 235 of the second wiring section 23B, and a part of the sixth conductive section 236 of the second wiring section 23B are exposed, out of the second arm circuit 2B. In addition, as shown in FIG. 5, the second terminal section 322 (second input terminal 32) is protruding in the thickness direction z, from the upper face of the second sealing section 72. The second sealing section 72 has, as show in FIG. 1 and FIG. 2, an annular fan shape in a plan view. As shown in FIG. 1, the second sealing section 72 is partly cut away, and a part of the fifth conductive section 235 of the second wiring section 23B, and a part of the sixth conductive section 236 are exposed, from such cutaway portion. To the fifth conductive section 235 and the sixth conductive section 236 of the second wiring section 23B, exposed from the second sealing section 72, the drive circuit Dr is connected.

The third sealing section 73 covers a part of the third arm circuit 2C. From the third sealing section 73, a part of the first conductive section 231 of the third wiring section 23C, a part of the fifth conductive section 235 of the third wiring section 23C, and a part of the sixth conductive section 236 of the third wiring section 23C are exposed, out of the third arm circuit 2C. In addition, as shown in FIG. 5, the third terminal section 323 (second input terminal 32) is protruding in the thickness direction z, from the upper face of the third sealing section 73. The third sealing section 73 has, as show in FIG. 1 and FIG. 2, an annular fan shape in a plan view. As shown in FIG. 1, the third sealing section 73 is partly cut away, and a part of the fifth conductive section 235 of the third wiring section 23C, and a part of the sixth conductive section 236 are exposed, from such cutaway portion. To the fifth conductive section 235 and the sixth conductive section 236 of the third wiring section 23C, exposed from the third sealing section 73, the drive circuit Dr is connected.

In the power module A1, as shown in FIG. 2, the first terminal section 321 (second input terminal 32), the first output terminal 4A (output terminal 4), and the first input terminal 31 are, in a plan view, aligned on a first straight line passing the first input terminal 31 (first radial direction r1 in FIG. 2). In addition, the elements of the first arm circuit 2A (first wiring section 23A, two first switching elements 21A, and two second switching elements 22A) are, in a plan view, symmetrically located, with respect to the first straight line passing the first terminal section 321, the first output terminal 4A, and the first input terminal 31 (first radial direction r1 in FIG. 2). Likewise, the second terminal section 322 (second input terminal 32), the second output terminal 4B (output terminal 4), and the first input terminal 31 are, in a plan view, aligned on a second straight line passing the first input terminal 31 (second radial direction r2 in FIG. 2). In addition, the elements of the second arm circuit 2B (second wiring section 23B, two first switching elements 21B, and two second switching elements 22B) are, in a plan view, symmetrically located, with respect to the second straight line passing the second terminal section 322, the second output terminal 4B, and the first input terminal 31 (second radial direction r2 in FIG. 2). Further, the third terminal section 323 (second input terminal 32), the third output terminal 4C (output terminal 4), and the first input terminal 31 are, in a plan view, aligned on a third straight line passing the first input terminal 31 (third radial direction r3 in FIG. 2). In addition, the elements of the third arm circuit 2C (third wiring section 23C, two first switching elements 21C, and two second switching elements 22C) are, in a plan view, symmetrically located, with respect to the third straight line passing the third terminal section 323, the third output terminal 4C, and the first input terminal 31 (third radial direction r3 in FIG. 2). In the power module A1, the first radial direction r1, the second radial direction r2, and the third radial direction r3 extend at regular angular intervals (in this embodiment, shifted by approximately 120°) about the first input terminal 31, in a plan view.

The power module A1 provides the following advantageous effects.

In the power module A1, the plurality of arm circuits 2 are located so as to overlap with a circle surrounding the first input terminal 31, in a plan view. With such a configuration, the current radially flows from the first input terminal 31 to each of the arm circuits 2, and therefore a difference in length of the current path, from the first input terminal 31 to each of the arm circuits 2, can be reduced. In other words, a difference in amount of the current, flowing from the first input terminal 31 to each of the arm circuits 2, can be minimized. Therefore, the inductance can be reduced in the power module A1 as a whole. In the power module A1, in particular, locating the first input terminal 31 at the center of the circle surrounding the first input terminal 31 (imaginary circle) in a plan view, contributes to levelling the amount of the current flowing from the first input terminal 31 to each of the arm circuits 2.

In the power module A1, the wiring pattern 23 includes the first wiring section 23A, the second wiring section 23B, and the third wiring section 23C. The first wiring section 23A constitutes a part of the first arm circuit 2A, the second wiring section 23B constitutes a part of the second arm circuit 2B, and the third wiring section 23C constitutes a part of the third arm circuit 2C. In addition, the first wiring section 23A, the second wiring section 23B, and the third wiring section 23C are located at regular angular intervals about the first input terminal 31, as viewed in the thickness direction z. In other words, in the configuration including the three arm circuits 2 (first arm circuit 2A, second arm circuit 2B, and third arm circuit 2C), the first wiring section 23A, the second wiring section 23B, and the third wiring section 23C are shifted from each other by 120 degrees in the circumferential direction s about the first input terminal 31, as viewed in the thickness direction z. Thus, the plurality of arm circuits 2 are generally evenly located in the circumferential direction s, about the first input terminal 31. Such a configuration allows the amount of the current flowing from the first input terminal 31 to each of the arm circuits 2 to be levelled, thereby further reducing the difference in amount of the current supplied to each of the arm circuits 2. Consequently, the inductance can be reduced in the power module A1 as a whole.

In the power module A1, the first terminal section 321, the first output terminal 4A, and the first input terminal 31 are, in a plan view, aligned on the first straight line passing the first input terminal 31 (along first radial direction r1 in FIG. 2). In addition, the elements of the first arm circuit 2A (first wiring section 23A, two first switching element 21A, and two second switching element 22A) are, in a plan view, symmetrically located, with respect to the first straight line passing the first terminal section 321, the first output terminal 4A, and the first input terminal 31 (first radial direction r1 in FIG. 2). Such a configuration minimizes the difference in length of the current path from the first input terminal 31 to the first output terminal 4A through each of the first switching elements 21, and also the difference in length of the current path from the first terminal section 321 to the first output terminal 4A through each of the second switching elements 22. Therefore, the power module A1 can reduce the inductance in the first arm circuit 2A. Likewise, since the second terminal section 322, the second output terminal 4B, and the first input terminal 31 are, in a plan view, aligned on the second straight line passing the first input terminal 31 (along second radial direction r2 in FIG. 2), and the elements of the second arm circuit 2B (second wiring section 23B, two first switching elements 21B, and two second switching elements 22B) are, in a plan view, symmetrically located, with respect to the second straight line passing the second terminal section 322, the second output terminal 4B, and the first input terminal 31 (second radial direction r2 in FIG. 2), the power module A1 can reduce the inductance in the second arm circuit 2B. Further, since the third terminal section 323 (second input terminal 32), the third output terminal 4C (output terminal 4), and the first input terminal 31 are, in a plan view, aligned on a third straight line passing the first input terminal 31 (along third radial direction r3 in FIG. 2), and the elements of the third arm circuit 2C (third wiring section 23C, two first switching elements 21C, and two second switching elements 22C) are, in a plan view, symmetrically located, with respect to the third straight line passing the third terminal section 323, the third output terminal 4C, and the first input terminal 31 (third radial direction r3 in FIG. 2), the power module A1 can reduce the inductance in the third arm circuit 2C.

In the power module A1, the insulation substrate 1 has a circular shape, in a plan view. The three-phase motor M normally has a circular columnar outer shape. Therefore, when the power module A1 is mounted on the three-phase motor M, the power module A1 generally overlaps with the three-phase motor M in a plan view, as shown in FIG. 1 and FIG. 2. Thus, the power module A1 has an advantageous shape, from the viewpoint of reduction in thickness and space saving, when mounted on the three-phase motor M.

Figure 7:
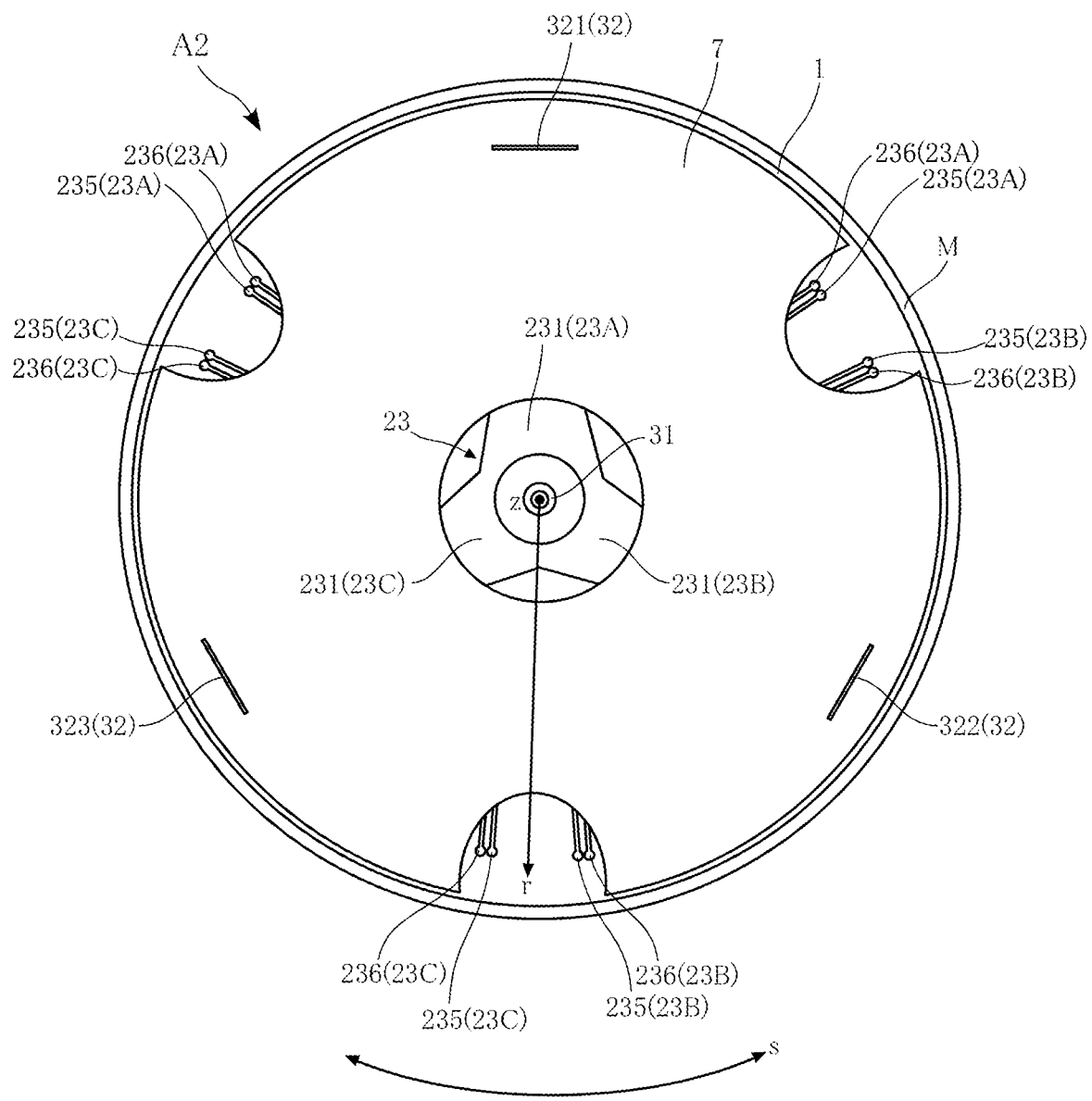
FIG. 7 is a plan view showing a power module according to a second embodiment.

FIG. 7 illustrates a power module A2 according to a second embodiment. FIG. 7 is a plan view showing the power module A2. As shown in FIG. 7, the power module A2 is different from the power module A1, in that the resin member 7 is not divided into three sections (first sealing section 71, second sealing section 72, and third sealing section 73).

The resin member 7 of the power module A2 has a circular shape in a plan view. The resin member 7 covers a part of each of the plurality of arm circuits 2. In the example shown in FIG. 7, The resin member 7 includes cutaway portions, from each of which a part of the fifth conductive section 235 and a part of the sixth conductive section 236 are to be exposed.

In the power module A2 also, like the power module A1, the plurality of arm circuits 2 are, in a plan view, located so as to overlap with a circle surrounding the first input terminal 31. Accordingly, a difference in amount of the current flowing from the first input terminal 31 to each of the arm circuits 2 can be minimized, and therefore the inductance can be reduced in the power module A2 as a whole.

Figure 8:
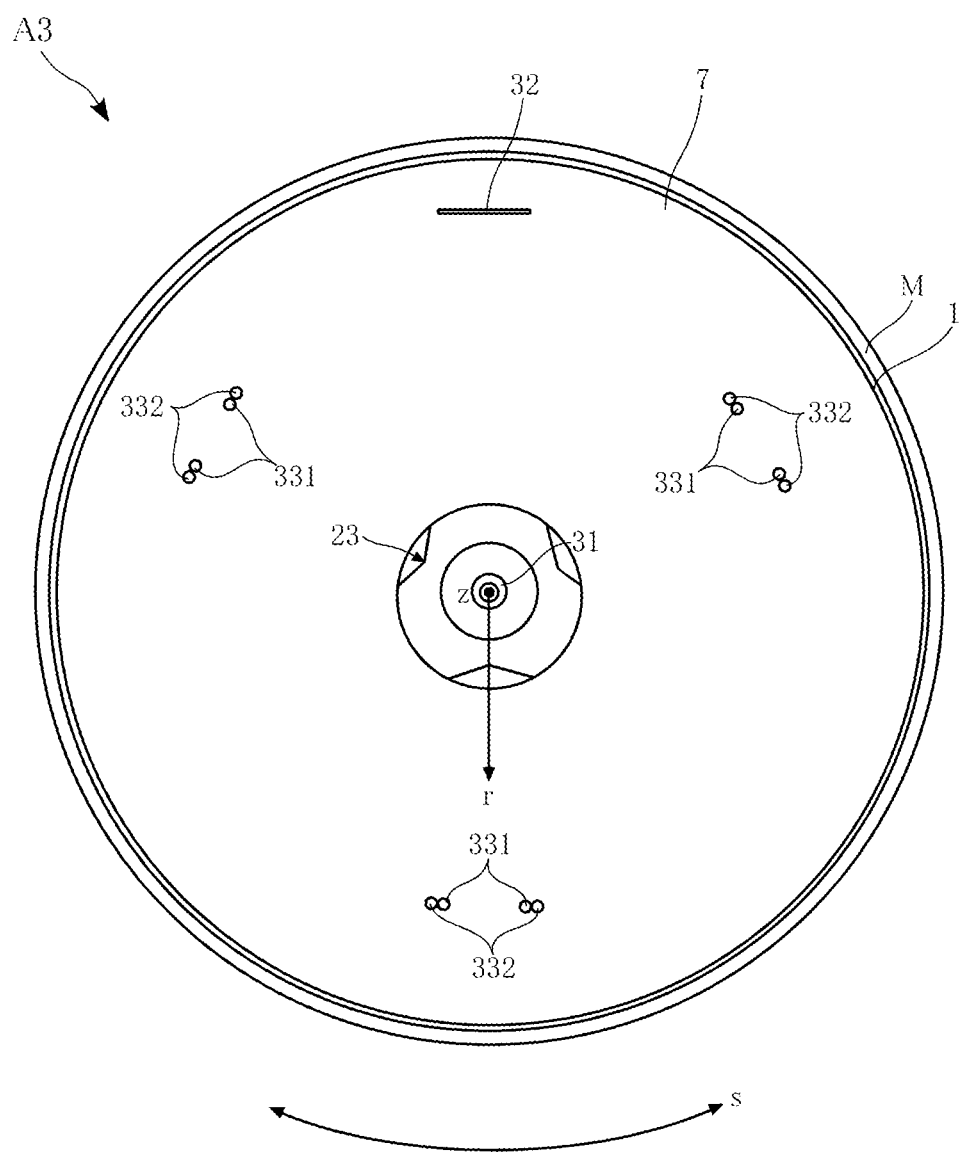
FIG. 8 is a plan view showing a power module according to a third embodiment.
Figure 9:
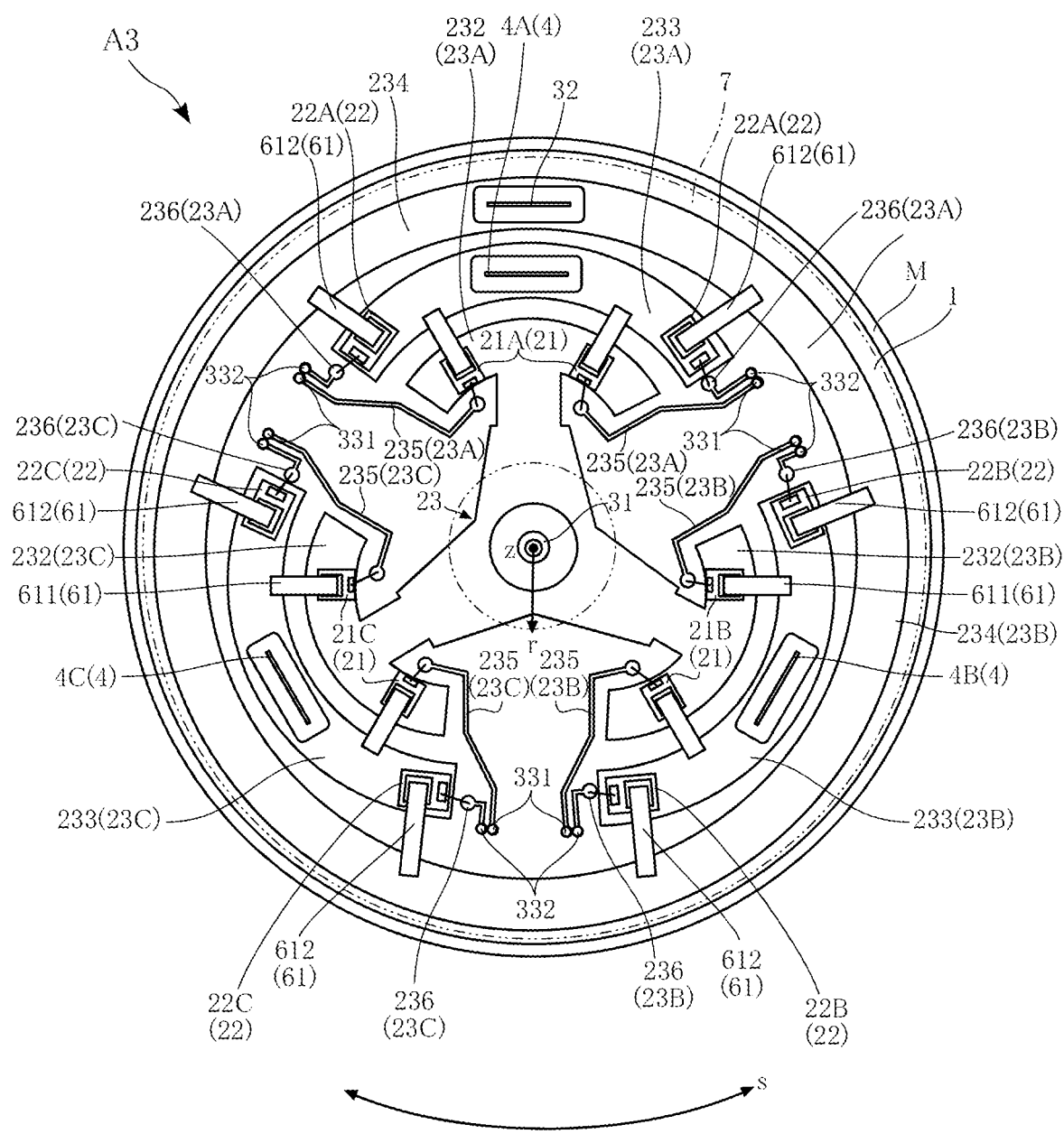
FIG. 9 is a plan view of the power module shown in FIG. 8, in which the resin member is indicated by imaginary lines.

FIG. 8 and FIG. 9 each illustrate a power module A3 according to a third embodiment. FIG. 8 is a plan view showing the power module A3. FIG. 9 is a plan view corresponding to FIG. 8, in which the resin member 7 is indicated by imaginary lines (dash-dot-dot lines). As shown in FIG. 8 and FIG. 9, the power module A3 is different from the power module A1, in that the second input terminal 32 is not separated into three sections (first terminal section 321, second terminal section 322, and third terminal section 323).

In the power module A3, the second input terminal 32 is not separated into the first terminal section 321, the second terminal section 322, and the third terminal section 323, but serves as a terminal common to the plurality of arm circuits 2. Accordingly, in the power module A3, the fourth conductive section 234 of the first wiring section 23A, the fourth conductive section 234 of the second wiring section 23B, and the fourth conductive section 234 of the third wiring section 23C become connected to each other, thereby forming a common fourth conductive section 234.

The fourth conductive section 234 has, for example, an annular shape in a plan view. In the example shown in FIG. 9, each of the fifth conductive sections 235 and each of the sixth conductive sections 236 are located on the inner side in the radial direction r, with respect to the common fourth conductive section 234. Accordingly, in the case where the resin member 7 of the power module A3 is partially cut away like the resin member 7 of the power module A2, the common fourth conductive section 234 is partially exposed. Therefore, the power module A3 includes a plurality of control terminals 331, and a plurality of control terminals 332.

The plurality of control terminals 331 each serve as the terminal for inputting the first control signal. As may be apparent from FIG. 8 and FIG. 9, the control terminals 331 are erected on the respective fifth conductive sections 235, and electrically continuous therewith. The control terminals 331 each extend in the thickness direction z from the fifth conductive section 235, and is protruding from the resin member 7.

The plurality of control terminals 332 each serve as the terminal for inputting the second control signal. As may be apparent from FIG. 8 and FIG. 9, the control terminals 332 are erected on the respective sixth conductive sections 236, and electrically continuous therewith. The control terminals 332 each extend in the thickness direction z from the sixth conductive section 236, and is protruding from the resin member 7.

In the power module A3 also, like the power modules A1 and A2, the plurality of arm circuits 2 are, in a plan view, located so as to overlap with a circle surrounding the first input terminal 31. Accordingly, a difference in amount of the current flowing from the first input terminal 31 to each of the arm circuits 2 can be minimized, and therefore the inductance can be reduced in the power module A2 as a whole.

Since the second input terminal 32 is not separated into three sections (first terminal section 321, second terminal section 322, and third terminal section 323) in the power module A3, the number of external terminals can be reduced, in the power module A3. However, from the viewpoint of reducing the inductance, it is preferable to separate the second input terminal 32 into three sections (first terminal section 321, second terminal section 322, and third terminal section 323), as in the power module A1.

Although the fifth conductive sections 235 and the sixth conductive sections 236 are located on the inner side in the radial direction r, with respect to the common fourth conductive section 234, in the third embodiment, the conductive sections 235 and 236 may be located on the outer side in the radial direction r, with respect to the fourth conductive section 234. In this case, the first control electrode 213c of each of the first switching elements 21 can be made electrically connected to the fifth conductive section 235, and the second control electrode 223c of each of the second switching elements 22 can be made electrically connected to the sixth conductive section 236, by routing the wire 62 so as to stride over the common fourth conductive section 234.

Figure 10:
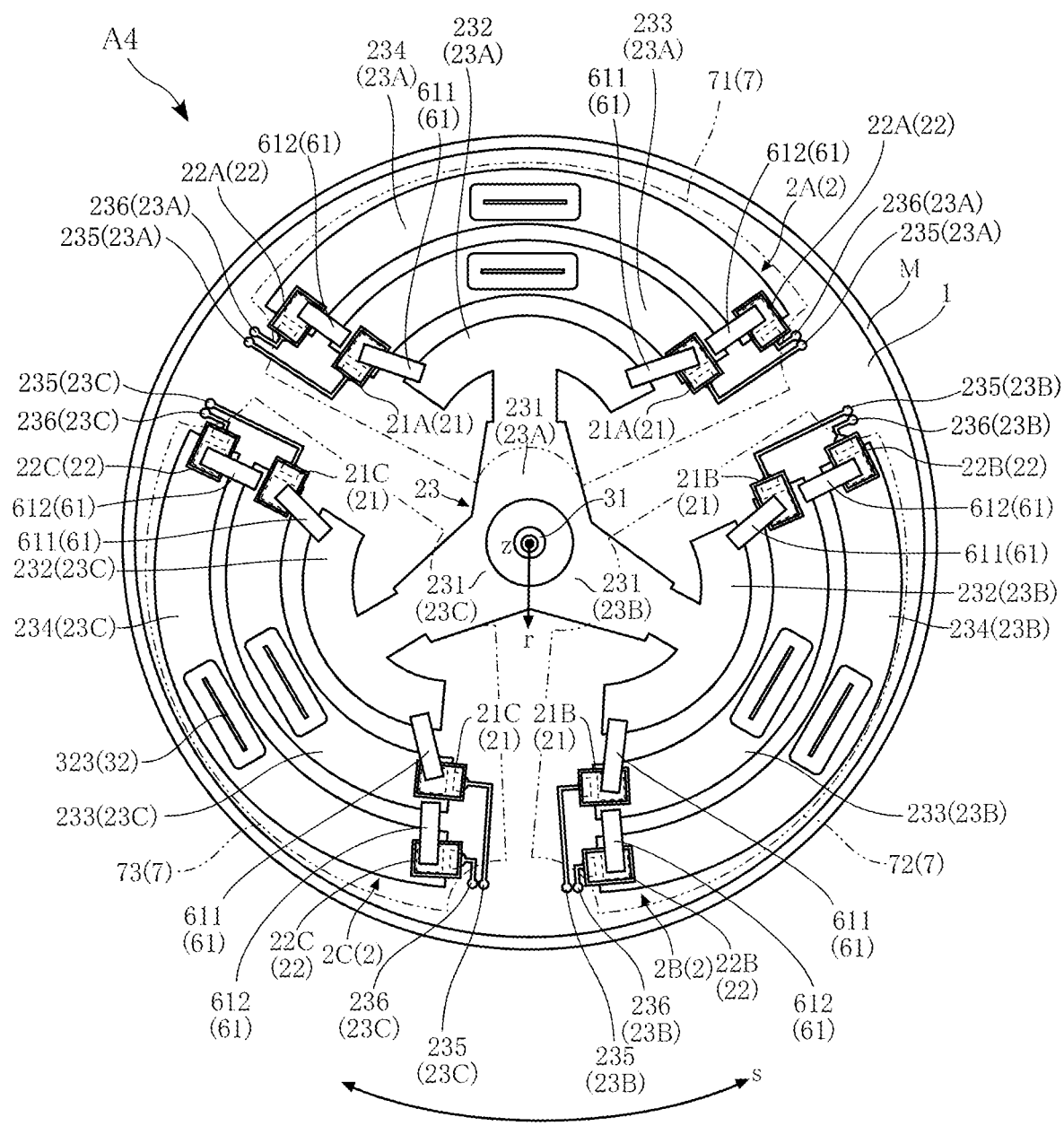
FIG. 10 is a plan view showing a power module according to a fourth embodiment, in which the resin member is indicated by imaginary lines.
Figure 11:
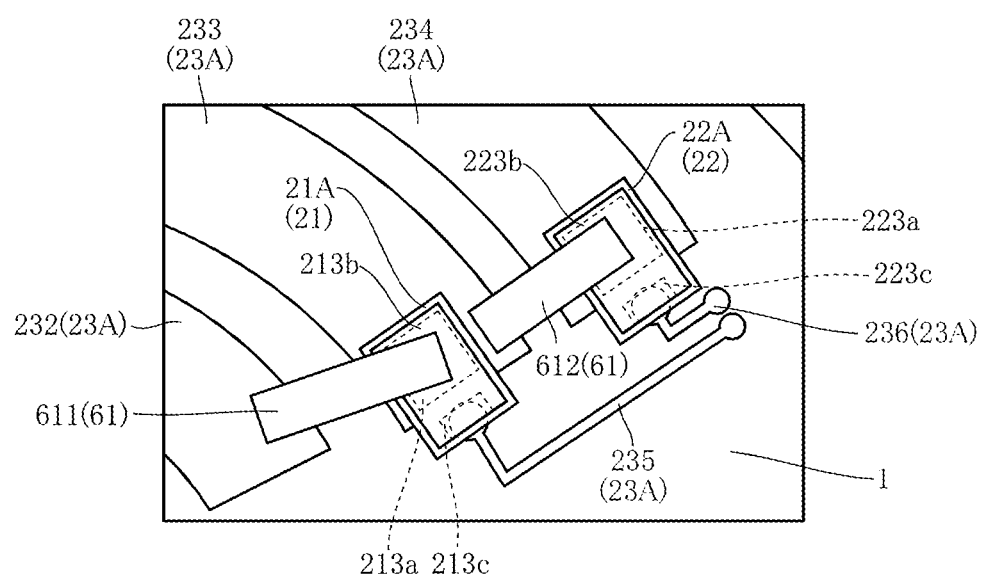
FIG. 11 is an enlarged view of a part of FIG. 10.

FIG. 10 and FIG. 11 each illustrate a power module A4 according to a fourth embodiment. FIG. 10 is a plan view showing the power module A4, in which the resin member 7 is indicated by imaginary lines (dash-dot-dot lines). FIG. 11 is a partially enlarged view from FIG. 10. In FIG. 11, the resin member 7 is excluded. As shown in FIG. 10 and FIG. 11, the power module A4 is different from the power module A1, in that the plurality of first switching elements 21 and the plurality of second switching elements 22 are each flip-chip mounted.

In the power module A4, the first element obverse face 211 of each of the first switching elements 21 is oriented downward in the thickness direction z, and the first element reverse face 212 is oriented upward in the thickness direction z. In other words, in the thickness direction z, the first element obverse face 211 is oriented to the same side as the substrate reverse face 12 is, and the first element reverse face 212 is oriented to the same side as the substrate obverse face 11 is. As may be apparent from FIG. 11, in each of the first switching elements 21, the first obverse face electrode 213a is connected to the third conductive section 233, and the first control electrode 213c is connected to the fifth conductive section 235. In addition, the first reverse face electrode 213b is electrically connected to the second conductive section 232, via the first conductor 611.

In the power module A4, the second element obverse face 221 of each of the second switching elements 22 is oriented downward in the thickness direction z, and the second element reverse face 222 is oriented upward in the thickness direction z. In other words, in the thickness direction z, the second element obverse face 221 is oriented to the same side as the substrate reverse face 12 is, and the second element reverse face 222 is oriented to the same side as the substrate obverse face 11 is. In each of the second switching elements 22, the second obverse face electrode 223a is connected to the fourth conductive section 234, and the second control electrode 223c is connected to the sixth conductive section 236. In addition, the second reverse face electrode 223b is electrically connected to the third conductive section 233, via the second conductor 612.

In the power module A4 also, like the power modules A1 to A3, the plurality of arm circuits 2 are, in a plan view, located so as to overlap with a circle surrounding the first input terminal 31. Accordingly, a difference in amount of the current flowing from the first input terminal 31 to each of the arm circuits 2 can be minimized, and therefore the inductance can be reduced in the power module A2 as a whole.

In the power module A4, the plurality of first switching elements 21 and the plurality of second switching elements 22 are each flip-chip mounted. Such a configuration eliminates the need to provide the plurality of wires 62, thereby contributing to reducing the material cost.

Figure 12:
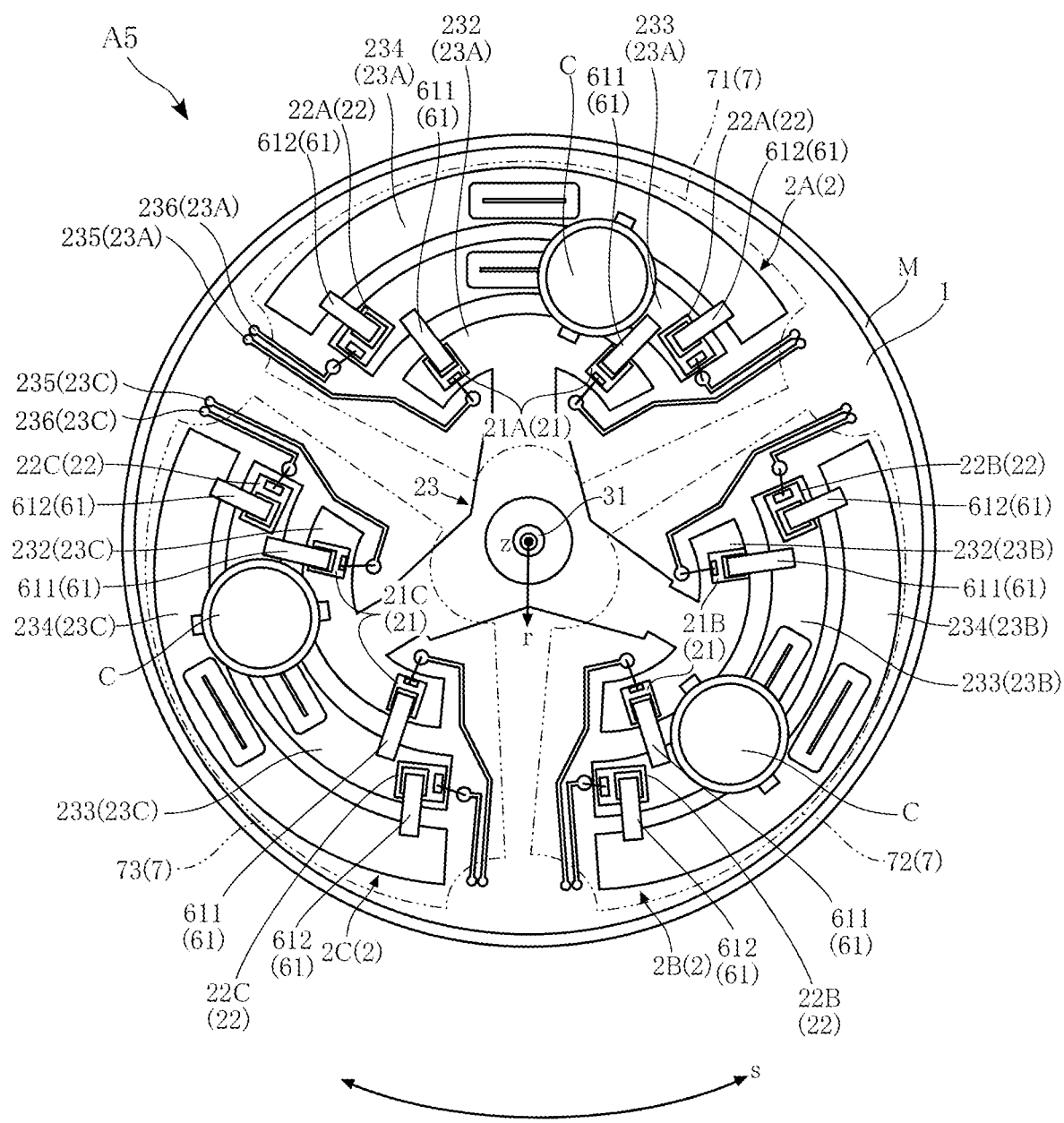
FIG. 12 is a plan view showing a power module according to a fifth embodiment, in which the resin member is indicated by imaginary lines.
Figure 13:
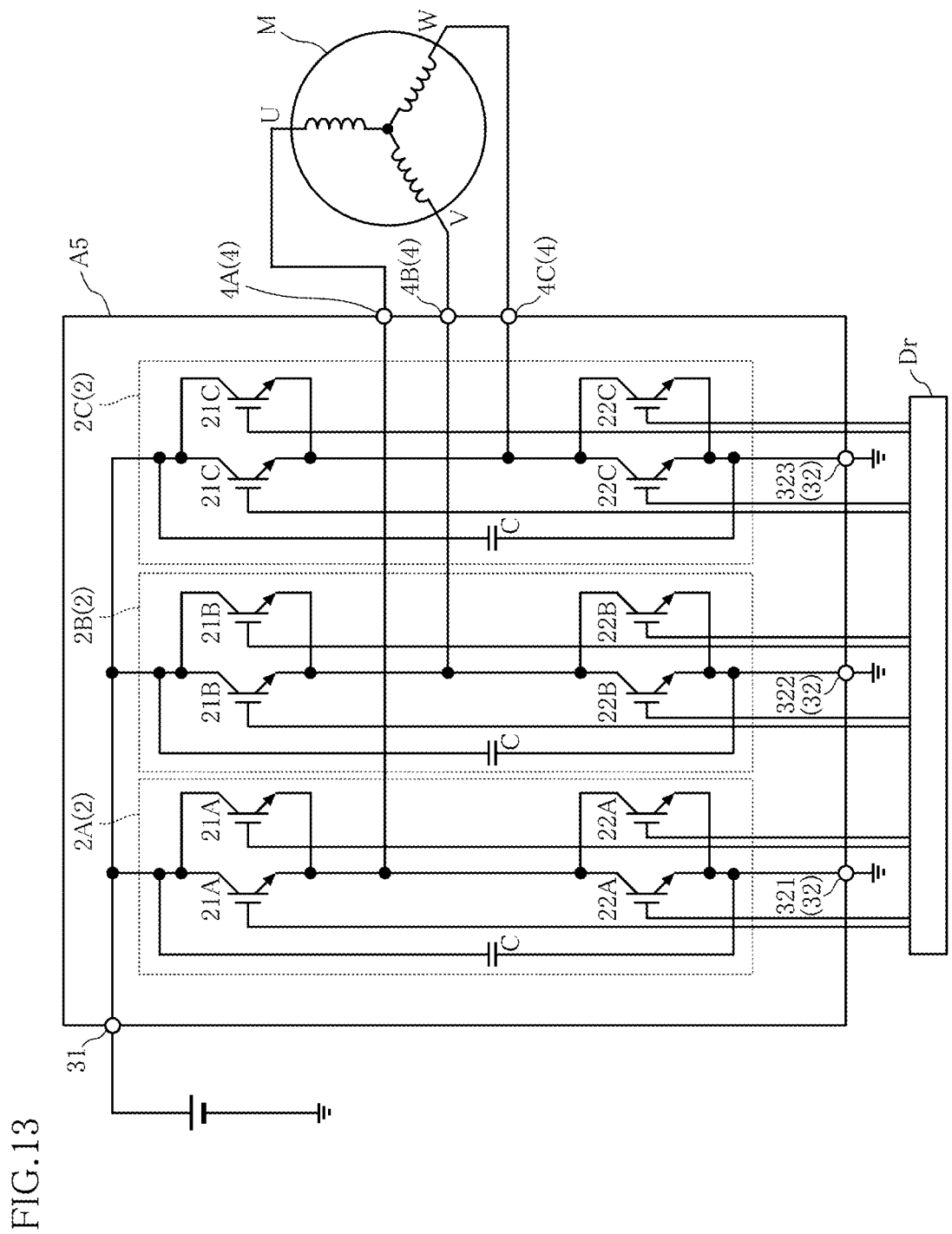
FIG. 13 is a diagram showing an exemplary circuit configuration of the power module according to the fifth embodiment.

FIG. 12 and FIG. 13 each illustrate a power module A5 according to a fifth embodiment. FIG. 12 is a plan view showing the power module A5, in which the resin member 7 is indicated by imaginary lines. FIG. 13 is a diagram showing an exemplary circuit configuration of the power module A5. As shown in FIG. 12 and FIG. 13, the power module A5 is different from the power module A1, in including snubber capacitors C.

As shown in FIG. 13, one each of the snubber capacitors C is provided for each arm circuit 2. As shown in FIG. 12 for example, the snubber capacitor C provided for the first arm circuit 2A has, for example, one terminal connected to the second conductive section 232 of the first wiring section 23A, and the other terminal connected to the fourth conductive section 234 of the first wiring section 23A. In the case of the snubber capacitor C provided for the second arm circuit 2B, for example, one terminal is connected to the second conductive section 232 of the second wiring section 23B, and the other terminal is connected to the fourth conductive section 234 of the second wiring section 23B. In the case of the snubber capacitor C provided for the third arm circuit 2C, for example, one terminal is connected to the second conductive section 232 of the third wiring section 23C, and the other terminal is connected to the fourth conductive section 234 of the third wiring section 23C. Although FIG. 12 illustrates an example where circular columnar snubber capacitors C are erected vertically, the snubber capacitors C may be laid down horizontally. The upper end portion of the snubber capacitor C may either be exposed from the resin member 7, or covered with the resin member 7. The terminals of the snubber capacitors C may be directly connected to the first wiring section 23A, the second wiring section 23B, and the third wiring section 23C respectively, thus to be electrically continuous therewith, or be electrically connected to the respective wiring sections via a conductor line. The size and the shape of the snubber capacitor C may be modified as appropriate, depending on a requirement of electrostatic capacitance. Further, the locations of the snubber capacitors C are not limited to the positions shown in FIG. 12, provided that the snubber capacitors C are mounted on the insulation substrate 1.

In the power module A5 also, like the power modules A1 to A4, the plurality of arm circuits 2 are, in a plan view, located so as to overlap with a circle surrounding the first input terminal 31. Accordingly, a difference in amount of the current flowing from the first input terminal 31 to each of the arm circuits 2 can be minimized, and therefore the inductance can be reduced in the power module A2 as a whole.

In the first embodiment to the fifth embodiment, the power modules A1 to A5 are configured as a three-phase inverter for driving the three-phase motor M. However, without limitation thereto, the power module may be a single-phase inverter. Examples of the single-phase inverter include a full-bridge inverter including two arm circuits 2. In this case, the two arm circuits 2 are located opposite to each other across the first input terminal 31, in a plan view.

The power module according to the present disclosure is not limited to the foregoing embodiments. The specific configuration of each of the elements of the power module according to the present disclosure may be modified as desired. For example, the power module according to the present disclosure encompasses embodiments according to the following clauses.

Clause 1

A power module including:
an insulation substrate;
a first input terminal supported by the insulation substrate;
a second input terminal supported by the insulation substrate;
a plurality of arm circuits provided on the insulation substrate; and
a plurality of output terminals corresponding to the plurality of arm circuits, respectively,
in which each of the plurality of arm circuits includes a part of a wiring pattern formed on the insulation substrate, and a first switching element and a second switching element mutually connected in series via the part of the wiring pattern,
each of the plurality of output terminals is connected to a connection point between the first switching element and the second switching element in a corresponding one of the plurality of arm circuits, and
the plurality of arm circuits are located so as to overlap with a circle surrounding the first input terminal, as viewed in a thickness direction the insulation substrate.

Clause 2

The power module according to Clause 1,
in which the plurality of arm circuits include a first arm circuit, a second arm circuit, and a third arm circuit,
the wiring pattern includes a first wiring section constituting the first arm circuit, a second wiring section constituting the second arm circuit, and a third wiring section constituting the third arm circuit, and
the plurality of output terminals include a first output terminal connected to the first wiring section, a second output terminal connected to the second wiring section, and a third output terminal connected to the third wiring section.

Clause 3

The power module according to Clause 2,
in which the first wiring section, the second wiring section, and the third wiring section are located at regular angular intervals about the first input terminal, as viewed in the thickness direction.

Clause 4

The power module according to Clause 2 or Clause 3,
in which the second input terminal include a first terminal section, a second terminal section, and a third terminal section, which are spaced apart from each other,
the first terminal section is connected to the first wiring section,
the second terminal section is connected to the second wiring section, and
the third terminal section is connected to the third wiring section.

Clause 5

The power module according to Clause 4,
in which the first terminal section, the first output terminal, and the first input terminal are aligned on a first straight line passing through the first input terminal,
the second terminal section, the second output terminal, and the first input terminal are aligned on a second straight line passing through the first input terminal, and
the third terminal section, the third output terminal, and the first input terminal are aligned on a third straight line passing through the first input terminal.

Clause 6

The power module according to Clause 4 or Clause 5,
in which the first wiring section, the second wiring section, and the third wiring section each include a first conductive section radially extending from the first input terminal, as viewed in the thickness direction, a second conductive section connected to the first conductive section, and electrically connected to the first switching element, a third conductive section electrically connected to a connection point between the first switching element and the second switching element, and a fourth conductive section electrically connected to the second switching element,
the first output terminal, the second output terminal, and the third output terminal are located in the third conductive section in the first wiring section, the third conductive section in the second wiring section, and the third conductive section in the third wiring section, respectively, and
the first terminal section, the second terminal section, and the third terminal section are located in the fourth conductive section in the first wiring section, the fourth conductive section in the second wiring section, and the fourth conductive section in the third wiring section, respectively.

Clause 7

The power module according to Clause 6,
in which the first wiring section, the second wiring section, and the third wiring section each further include a fifth conductive section to which a first control signal for controlling a switching operation of the first switching element is inputted, and a sixth conductive section to which a second control signal for controlling a switching operation of the second switching element is inputted.

Clause 8

The power module according to Clause 7,
in which the insulation substrate includes a substrate obverse face oriented to one side in the thickness direction, and having the wiring pattern formed thereon.

Clause 9

The power module according to Clause 8,
in which the first switching element in each of the first arm circuit, the second arm circuit, and the third arm circuit includes a first element obverse face and a first element reverse face spaced apart from each other in the thickness direction,
a first obverse face electrode and a first control electrode are located on the first element obverse face,
a first reverse face electrode is located on the first element reverse face, and
the first switching element in each of the first arm circuit, the second arm circuit, and the third arm circuit makes the first obverse face electrode and the first reverse face electrode electrically connected to each other, according to the first control signal inputted to the first control electrode.

Clause 10

The power module according to Clause 9,
in which the first element obverse face of the first switching element, in each of the first arm circuit, the second arm circuit, and the third arm circuit, is oriented to a same side as the substrate obverse face is,
the first reverse face electrode is conductively connected to the second conductive section in each of the first wiring section, the second wiring section, and the third wiring section,
the first obverse face electrode is electrically connected to the third conductive section in each of the first wiring section, the second wiring section, and the third wiring section, via a first conductor, and
the first control electrode is electrically connected to the fifth conductive section in each of the first wiring section, the second wiring section, and the third wiring section, via a first wire.

Clause 11

The power module according to Clause 9 or Clause 10,
in which the second switching element in each of the first arm circuit, the second arm circuit, and the third arm circuit includes a second element obverse face and a second element reverse face spaced apart from each other in the thickness direction, a second obverse face electrode and a second control electrode are located on the second element obverse face, a second reverse face electrode is located on the second element reverse face, and the second switching element in each of the first arm circuit, the second arm circuit, and the third arm circuit makes the second obverse face electrode and the second reverse face electrode electrically connected to each other, according to the second control signal inputted to the second control electrode.

Clause 12

The power module according to Clause 11, in which the second element obverse face of the second switching element, in each of the first arm circuit, the second arm circuit, and the third arm circuit, is oriented to the same side as the substrate obverse face is, the second reverse face electrode is conductively connected to the third conductive section in each of the first wiring section, the second wiring section, and the third wiring section, the second obverse face electrode is electrically connected to the fourth conductive section in each of the first wiring section, the second wiring section, and the third wiring section, via a second conductor, and the second control electrode is electrically connected to the sixth conductive section in each of the first wiring section, the second wiring section, and the third wiring section, via a second wire.

Clause 13

The power module according to any one of Clause 8 to Clause 12, further including an insulative resin member located on the substrate obverse face, in which the resin member covers a part of each of the first wiring section, the second wiring section, and the third wiring section, and the first arm circuit, the second arm circuit, and the third arm circuit, and exposes a part of the first input terminal and a part of the second input terminal.

Clause 14

The power module according to Clause 13, in which the resin member includes a first sealing section, a second sealing section, and a third sealing section separately located from each other, the first sealing section covers a part of the first wiring section, and the first arm circuit, the second sealing section covers a part of the second wiring section, and the second arm circuit, and the third sealing section covers a part of the third wiring section, and the third arm circuit.

Clause 15

The power module according to any one of Clause 8 to Clause 14, in which the insulation substrate further includes a substrate reverse face oriented to an opposite side to the substrate obverse face, in the thickness direction, and a three-phase motor is located on a side of the substrate reverse face.

Clause 16

The power module according to Clause 15, in which the first output terminal, the second output terminal, and the third output terminal are each formed so as to penetrate through the insulation substrate in the thickness direction, the first output terminal is connected to a U-phase of the three-phase motor, on the side of the substrate reverse face in the thickness direction, the second output terminal is connected to a V-phase of the three-phase motor, on the side of the substrate reverse face in the thickness direction, and the third output terminal is connected to a W-phase of the three-phase motor, on the side of the substrate reverse face in the thickness direction.

Clause 17

The power module according to any one of Clause 1 to Clause 16, in which the insulation substrate has a circular shape, as viewed in the thickness direction.

Clause 18

The power module according to any one of Clause 1 to Clause 17, in which the first input terminal is a positive electrode, and the second input terminal is a negative electrode.

REFERENCE SIGNS LIST

A1 to A5: power module 1: insulation substrate
11: substrate obverse face 12: substrate reverse face
2: arm circuit 2A: first arm circuit
2B: second arm circuit 2C: third arm circuit
21, 21A, 21B, 21C: first switching element
211: first element obverse face 212: first element reverse face
213a: first obverse face electrode
213b: first reverse face electrode
213c: first control electrode
22, 22A, 22B, 22C: second switching element
221: second element obverse face
222: second element reverse face
223a: second obverse face electrode
223b: second reverse face electrode
223c: second control electrode 23: wiring pattern
23A: first wiring section 23B: second wiring section
23C: third wiring section 231: first conductive section
232: second conductive section 233: third conductive section
234: fourth conductive section 235: fifth conductive section
236: sixth conductive section 31: first input terminal
32: second input terminal 321: first terminal section
322: second terminal section 323: third terminal section
331, 332: control terminal 4: output terminal
4A: first output terminal 4B: second output terminal
4C: third output terminal 61: conductor
611: first conductor 612: second conductor
62: wire 621: first wire
622: second wire 7: resin member
71: first sealing section 72: second sealing section
73: third sealing section C: snubber capacitor
Dr: drive circuit M: three-phase motor

The invention claimed is:
1. A power module comprising:
an insulation substrate;
a first input terminal supported by the insulation substrate;
a second input terminal supported by the insulation substrate;
a plurality of arm circuits provided on the insulation substrate; and
a plurality of output terminals corresponding to the plurality of arm circuits, respectively,
wherein each of the plurality of arm circuits includes a part of a wiring pattern formed on the insulation substrate, and includes a first switching element and a second switching element mutually connected in series via the part of the wiring pattern,
each of the plurality of output terminals is connected to a connection point between the first switching element and the second switching element in a corresponding one of the plurality of arm circuits,
the plurality of arm circuits are located so as to overlap with a circle surrounding the first input terminal, as viewed in a thickness direction of the insulation substrate,
the plurality of arm circuits include a first arm circuit, a second arm circuit, and a third arm circuit,
the wiring pattern includes a first wiring section constituting the first arm circuit, a second wiring section constituting the second arm circuit, and a third wiring section constituting the third arm circuit,
the plurality of output terminals include a first output terminal connected to the first wiring section, a second output terminal connected to the second wiring section, and a third output terminal connected to the third wiring section,
the second input terminal include a first terminal section, a second terminal section, and a third terminal section, which are spaced apart from each other,
the first terminal section is connected to the first wiring section,
the second terminal section is connected to the second wiring section,
the third terminal section is connected to the third wiring section,
the first wiring section, the second wiring section, and the third wiring section each include a first conductive section radially extending from the first input terminal as viewed in the thickness direction, a second conductive section connected to the first conductive section and electrically connected to the first switching element, a third conductive section electrically connected to a connection point between the first switching element and the second switching element, and a fourth conductive section electrically connected to the second switching element,
the first output terminal, the second output terminal, and the third output terminal are located in the third conductive section in the first wiring section, the third conductive section in the second wiring section, and the third conductive section in the third wiring section, respectively, and
the first terminal section, the second terminal section, and the third terminal section are located in the fourth conductive section in the first wiring section, the fourth conductive section in the second wiring section, and the fourth conductive section in the third wiring section, respectively.

2. The power module according to claim 1,
wherein the first wiring section, the second wiring section, and the third wiring section are located at regular angular intervals about the first input terminal, as viewed in the thickness direction.

3. The power module according to claim 1,
wherein the first terminal section, the first output terminal, and the first input terminal are aligned on a first straight line passing through the first input terminal,
the second terminal section, the second output terminal, and the first input terminal are aligned on a second straight line passing through the first input terminal, and
the third terminal section, the third output terminal, and the first input terminal are aligned on a third straight line passing through the first input terminal.

4. The power module according to claim 1,
wherein the first wiring section, the second wiring section, and the third wiring section each further include a fifth conductive section to which a first control signal for controlling a switching operation of the first switching element is inputted, and a sixth conductive section to which a second control signal for controlling a switching operation of the second switching element is inputted.

5. The power module according to claim 4,
wherein the insulation substrate includes a substrate obverse face oriented to one side in the thickness direction and having the wiring pattern formed thereon.

6. The power module according to claim 5,
wherein the first switching element in each of the first arm circuit, the second arm circuit, and the third arm circuit includes a first element obverse face and a first element reverse face spaced apart from each other in the thickness direction,
a first obverse face electrode and a first control electrode are located on the first element obverse face,
a first reverse face electrode is located on the first element reverse face, and
the first switching element in each of the first arm circuit, the second arm circuit, and the third arm circuit makes the first obverse face electrode and the first reverse face electrode electrically connected to each other, according to the first control signal inputted to the first control electrode.

7. The power module according to claim 6,
wherein the first element obverse face of the first switching element, in each of the first arm circuit, the second arm circuit, and the third arm circuit, is oriented to a same side as the substrate obverse face is,
the first reverse face electrode is conductively connected to the second conductive section in each of the first wiring section, the second wiring section, and the third wiring section,
the first obverse face electrode is electrically connected to the third conductive section in each of the first wiring section, the second wiring section, and the third wiring section, via a first conductor, and
the first control electrode is electrically connected to the fifth conductive section in each of the first wiring section, the second wiring section, and the third wiring section, via a first wire.

8. The power module according to claim 6,
wherein the second switching element in each of the first arm circuit, the second arm circuit, and the third arm circuit includes a second element obverse face and a second element reverse face spaced apart from each other in the thickness direction,
a second obverse face electrode and a second control electrode are located on the second element obverse face,
a second reverse face electrode is located on the second element reverse face, and
the second switching element in each of the first arm circuit, the second arm circuit, and the third arm circuit makes the second obverse face electrode and the second reverse face electrode electrically connected to each other, according to the second control signal inputted to the second control electrode.

9. The power module according to claim 8,
wherein the second element obverse face of the second switching element, in each of the first arm circuit, the second arm circuit, and the third arm circuit, is oriented to the same side as the substrate obverse face is,
the second reverse face electrode is conductively connected to the third conductive section in each of the first wiring section, the second wiring section, and the third wiring section,
the second obverse face electrode is electrically connected to the fourth conductive section in each of the first wiring section, the second wiring section, and the third wiring section, via a second conductor, and
the second control electrode is electrically connected to the sixth conductive section in each of the first wiring section, the second wiring section, and the third wiring section, via a second wire.

10. The power module according to claim 5, further comprising an insulative resin member located on the substrate obverse face,
wherein the resin member covers a part of each of the first wiring section, the second wiring section, and the third wiring section, and the first arm circuit, the second arm circuit, and the third arm circuit, and exposes a part of the first input terminal and a part of the second input terminal.

11. The power module according to claim 10,
wherein the resin member includes a first sealing section, a second sealing section, and a third sealing section separately located from each other,
the first sealing section covers a part of the first wiring section, and the first arm circuit,
the second sealing section covers a part of the second wiring section, and the second arm circuit, and
the third sealing section covers a part of the third wiring section, and the third arm circuit.

12. The power module according to claim 5,
wherein the insulation substrate further includes a substrate reverse face oriented to an opposite side to the substrate obverse face, in the thickness direction, and
a three-phase motor is located on a side of the substrate reverse face.

13. The power module according to claim 12,
wherein the first output terminal, the second output terminal, and the third output terminal are each formed so as to penetrate through the insulation substrate in the thickness direction,
the first output terminal is connected to a U-phase of the three-phase motor, on the side of the substrate reverse face in the thickness direction,
the second output terminal is connected to a V-phase of the three-phase motor, on the side of the substrate reverse face in the thickness direction, and
the third output terminal is connected to a W-phase of the three-phase motor, on the side of the substrate reverse face in the thickness direction.

14. The power module according to claim 1,
wherein the insulation substrate has a circular shape, as viewed in the thickness direction.

15. The power module according to claim 1,
wherein the first input terminal is a positive electrode, and the second input terminal is a negative electrode.

* * * * *